US005877555A

United States Patent [19]

Leighton et al.

[11] Patent Number: 5,877,555

[45] Date of Patent: Mar. 2, 1999

[54] DIRECT CONTACT DIE ATTACH

[75] Inventors: Larry C. Leighton, Santa Cruz; Thomas W. Moller, Gilroy, both of Calif.

[73] Assignee: Ericsson, Inc., Morgan Hill, Calif.

[21] Appl. No.: 771,402

[22] Filed: Dec. 20, 1996

[51] Int. Cl.[6] .......... H01L 23/12

[52] U.S. Cl. .......... 257/732; 257/664; 257/727; 257/728; 257/785; 257/676

[58] Field of Search .......... 257/727, 732, 257/785, 664, 676, 728

[56] References Cited

U.S. PATENT DOCUMENTS

| | | | |
|---|---|---|---|
| 3,614,832 | 10/1971 | Chance et al. | 257/785 |
| 3,842,189 | 10/1974 | Southgate | 257/785 |
| 3,962,669 | 6/1976 | Entine et al. | 257/785 |
| 5,130,783 | 7/1992 | McLellan | 257/727 |
| 5,138,434 | 8/1992 | Wood et al. | 257/727 |
| 5,237,203 | 8/1993 | Massaron | 257/727 |
| 5,331,513 | 7/1994 | Hirai et al. | 257/785 |
| 5,389,819 | 2/1995 | Matsuoka | 257/727 |
| 5,578,879 | 11/1996 | Farnsworth et al. | 257/727 |
| 5,663,596 | 9/1997 | Little | 257/727 |

FOREIGN PATENT DOCUMENTS

| | | | |
|---|---|---|---|
| 2 278 727 A | 6/1996 | France . | |
| 11 07 295 B | 5/1961 | Germany . | |
| 0 602 278 A1 | 6/1994 | Germany . | |
| 1-39036 | 2/1989 | Japan | 257/727 |
| 1 279 782 | 6/1972 | United Kingdom . | |

OTHER PUBLICATIONS

Formikell et al, 'Leaf Spring Contractor Assembly' IBM Tech. Dis. Bull. vol. 17 No. 3 pp. 651–652, Aug. 1974.

B.E. Hart et al.: "Low–inductance Transistor", IBM Technical Disclosure Bulletin, vol. 14, No. 3, Aug. 1971, New York, pp. 706–707, XP002063488, see p. 707, paragraph 2–4.

*Primary Examiner*—David Ostrowski
*Attorney, Agent, or Firm*—Lyon & Lyon LLP

[57] ABSTRACT

A semiconductor die is attached to a transistor package by a plurality of resilient clamping members, which are bonded at one end to a top surface of the semiconductor die and at another end to a stable surface, such as an emitter, collector, or base lead frame, of the transistor package. The shape and composition of the clamping members provides a resilient force that causes a bottom surface of the die to make and maintain substantially uniform and constant contact with the die attach area of the transistor package, e.g., a mounting flange or non-conductive substrate. The clamping members are preferably conductive and can conduct current from respective transistor cell locations on the die to the respective lead frames to which the clamping members are bonded.

6 Claims, 4 Drawing Sheets

DIRECT CONTACT DIE ATTACH

FIELD OF THE INVENTION

The present invention pertains to methods and apparatus for attaching a semiconductor die to a transistor package.

BACKGROUND

In general, one or more transistor cells (or "chips") are formed on a conductive die, e.g., silicon, which is then attached to a mounting flange as part of a transistor "package." In particular, the conductive die is either attached directly to the flange, or to a non-conductive substrate atop the flange, such as, e.g., beryllium oxide, which acts as an intermediary layer. In either case, a "die-bonding" material, such as, e.g., solder, metal-filled epoxy, or glass, is used to attach the die to the respective flange or substrate. Because the failure rate of transistors is proportional to the temperature of the active area, or junction, of the transistor, one of the most important issues in packaging power transistors is thermal performance. Thus, in order for a die having a plurality of transistors formed thereon to easily transfer heat to an attached heat sink—e.g., via the flange—the die-bonding interface between the die and the heatsink must have a low thermal resistance. Therefore, in addition to providing mechanical support, the bonding material used to attach the die to the package must have a high thermal conductivity.

Epoxy is the most common of these materials and is used in low frequency and DC transistor applications. However, epoxy is a poor thermal conductor, which precludes its use in high frequency applications, such as RF power transistor devices. Instead, hard solders are employed in such devices. Hard solders are relatively low temperature melting alloys that have high strengths, a relatively high thermal conductivity, and are substantially free from thermal fatigue, resulting in elastic, rather than plastic, deformation. Although there exists a number of different hard solders used for attaching dies to packages, a gold-silicon alloy, having a eutectic melting point of 363° C., is the mostly widely used for high frequency applications.

In particular, as illustrated in FIG. 1, the package is heated to 410° C., and the die is then placed on a die attach area of the package (i.e., on the respective mounting flange or non-conductive substrate) with a vacuum tool, and scrubbed against the surface manually until a sufficient melt is formed. A noted problem with this technique, however, is that the die is exposed to relatively high temperatures. In particular, the use of the gold-silicon eutectic as the bonding medium can introduce significant stress in the die upon cooling or under power cycling of the device, due to the lack of plastic deformation ability of the gold-silicon eutectic. These thermal effects can cause cracks if the generated stress exceeds the ultimate strength of silicon. To handle this stress, the use of complex and expensive materials and processes are required. Moreover, to minimize the thermal effects caused by the high processing temperature, the materials surrounding the semiconductor die must have a thermal expansion coefficient that matches that of the die, which greatly limits the choice of materials that can be used.

For instance, referring to FIG. 2, an unsealed prior art power transistor package 10 includes a conductive mounting flange 14 used to conduct heat dissipated from an attached silicon die 12 to a heat sink (not shown). In order to properly perform, the flange 14 must have a thermal expansion coefficient that is approximately that of silicon, (i.e., $2.6\times10^{-6}$/°C.). Copper-tungsten (15% Cu), having a thermal expansion coefficient of $7.0\times10^{-6}$/°C., is extensively used for this purpose because of its relatively low expansion coefficient. Although this copper-tungsten alloy has a relatively high thermal conductivity (178W/m-K), it would be more desirable to exchange the copper-tungsten (15% Cu) flange with a flange composed of a metal with a higher thermal conductivity, such as pure copper. However, because pure copper has a thermal expansion coefficient ($16.5\times10^{-6}$/°C.) that is more than six times that of silicon, it cannot be practically used when the chip is processed at the relatively high temperature required for gold-silicon eutectic bonding.

Likewise, even where in intermediary substrate 16 is used to electrically isolate the silicon die 12 from the flange 14, the substrate 16 must have a thermal expansion coefficient close to that of silicon. It must also provide good electrical isolation with minimum capacitance and conductance. Beryllium oxide (BeO), having a thermal expansion coefficient of $8.0\times10^{-6}$/°C., is extensively used for this purpose, since it meets the requirements stated above and is fairly inexpensive compared to, for example, industrial diamond, which has the best overall characteristics, exclusive of cost. Nonetheless, the thermal conductivity and expansion limitations imposed due to the die bonding requirement can restrict the use of other, otherwise advantageous substrate materials.

It is, therefore, desirable to provide an alternative process to attach a semiconductor die to the substrate, which can be performed at a relatively low temperature.

SUMMARY OF THE INVENTION

The present invention overcomes the problems and disadvantages of the prior art through the use of a temperature independent, direct contact die attach. In particular, in accordance with a general aspect of the invention, a plurality of resilient clamping members are used to attach a semiconductor die to a die attach area of a power transistor package.

In a preferred embodiment, the clamping members are bonded at one end to a top surface of the semiconductor die and at another end to a stable surface such as an emitter, collector, or base lead frame. The shape and composition of the clamping members provides a resilient force that causes a bottom surface of the die to make and maintain substantially uniform and constant contact with the die attach area of the transistor package, e.g., a mounting flange or non-conductive substrate. The clamping members are preferably conductive and can conduct current from respective transistor cell locations on the die to the respective lead frames to which the clamping members are bonded.

As will be apparent to those skilled in the art, other and further objects and advantages will appear hereinafter.

BRIEF DESCRIPTION OF THE DRAWINGS

The drawings illustrate both the design and utility of preferred embodiments of the present invention, in which.

Detailed Description of Preferred Embodiments

Figure 1:
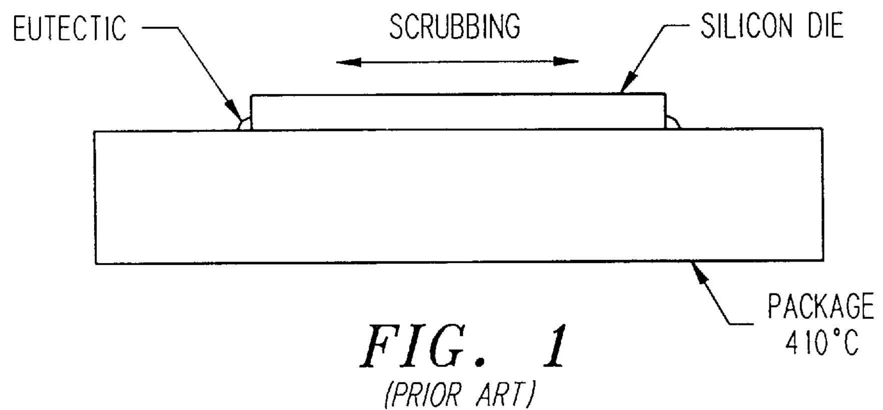
FIG. 1 is a side view of a prior art eutectic bonding process for attaching a semiconductor die to a transistor package substrate.
Figure 2:
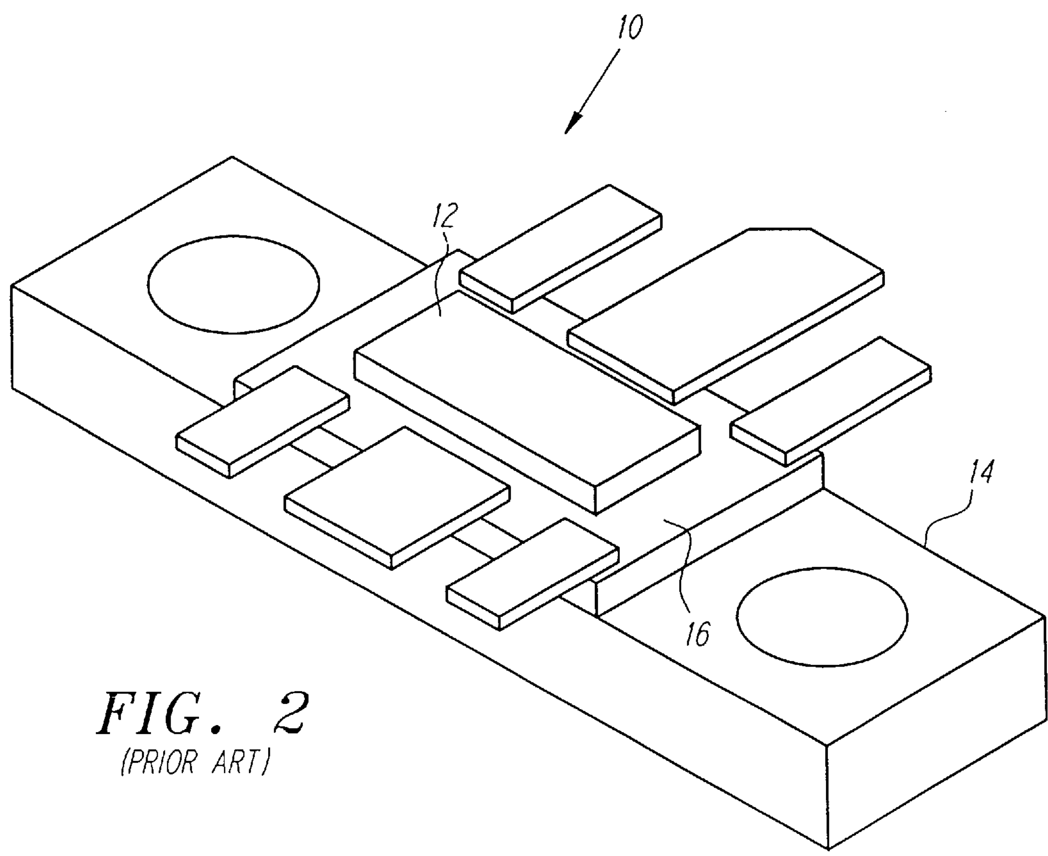
FIG. 2 is a perspective view of a prior art (unsealed) power transistor package.
Figure 3:
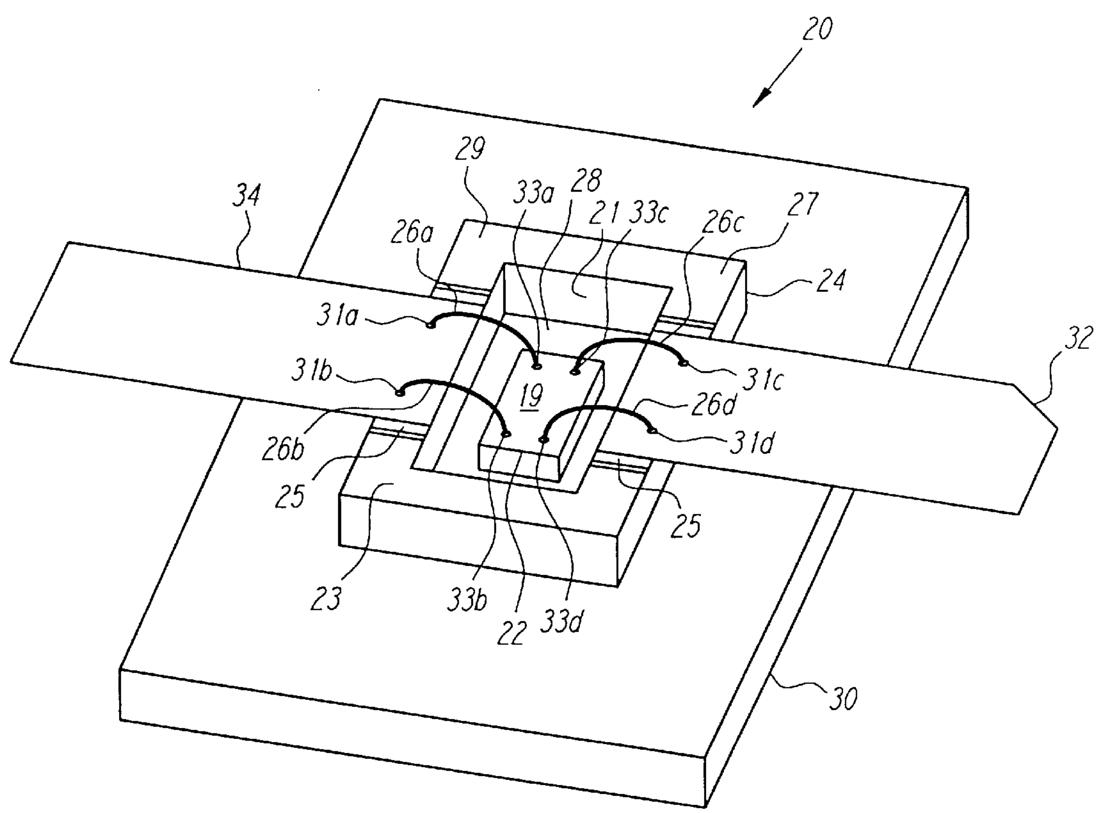
FIG. 3 is a perspective view of a first preferred embodiment of a power transistor package employing a direct contact die attach in accordance with the present invention.

Referring to FIG. 3, a power transistor package 20 includes a silicon die 22, which is attached to a top surface 28 of a mounting flange 30 by first, second, third and fourth clamping members 26*a–d*. In particular, a bottom surface of the silicon die 22 (not seen in FIG. 3) is in substantially uniform contact with the top surface 28 of the flange 30. Further, while the bottom surface of the silicon die 22 and the top surface 28 of the flange 30 may each be gold plated to prevent oxidation, gold plating is not necessary since the silicon die 22 is not eutectically bonded to the flange 30, thus providing for a relatively inexpensive process for manufacturing the power transistor package 20.

A rectangular shaped, ceramic substrate 24 having a rectangular window 21 is suitably bonded to the top surface 28 of flange 30, i.e., using techniques known in the art, wherein the window 21 encloses the die attach area. The ceramic substrate 24 is preferably composed of an electrically isolating, but thermally conductive material, such as, e.g., alumina. A gold coating 25 is applied on opposing edges 27 and 29 of a top surface 23 of substrate 24, also using techniques known in the art, wherein input (i.e., emitter or base) and output (i.e, collector) lead frames 32 and 34, respectively, are eutectically bonded to the gold coating 25 on the opposing edges 27 and 29.

In accordance with the present invention, the respective clamping members 26*a–d* support and hold the silicon die 22 in place. In particular, respective first ends of the first and second clamping members 26*a–b* are bonded (e.g., by using known ultrasonic wire bonding techniques) to corresponding "anchor points" 31*a–b* on the input lead frame 34, and respective first ends of the third and fourth clamping members 26*c–d* are bonded to corresponding anchor points 31*c–d* on the output lead frame 32. Respective second ends of the clamping members 26*a–d* are bonded to corresponding anchor points 33a-d on a top surface 19 of the silicon die 22.

The clamping members 26*a–d* are preferably made of a suitable material (e.g., aluminum or a gold or aluminum alloy), such that they are sufficiently resilient to both stabilize and maintain the bottom surface of the silicon die 22 in constant contact with the top surface of the flange 30. Further, the selected length and bend of the clamping members 26*a–d* is preferably configured such that they each apply a substantially equivalent amount of pressure to the respective anchor points 33*a–d*, which are preferably symmetrically located across the top surface 19 of the silicon die 22. In this manner, the force exerted on the bottom surface of the silicon die 22 by the top surface 28 of the flange 30 is substantially evenly distributed.

The clamping members 26*a–d* are preferably conductive, such that the respective second ends of first and second clamping members 26*a–b*, which have first ends bonded to the input (i.e, emitter or base) lead frame 34, can be bonded to anchor points 33*a–b* located on corresponding input (i.e, emitter or base) leads (not shown) of a respective transistor cell on the silicon die 22. Likewise, the respective second ends of third and fourth clamping members 26*c–d*, which have first ends bonded to the output (i.e, emitter or base) lead frame 32, can be bonded to anchor points 33*c–d* located on corresponding output (i.e, collector) leads (not shown) of a respective transistor cell on the silicon die 22. In this manner, the clamping members may advantageously provide an additional function of electrically connecting one or more transistor cells (not shown) on the die 22 to the respective lead frames 32 and 34.

Figure 4:
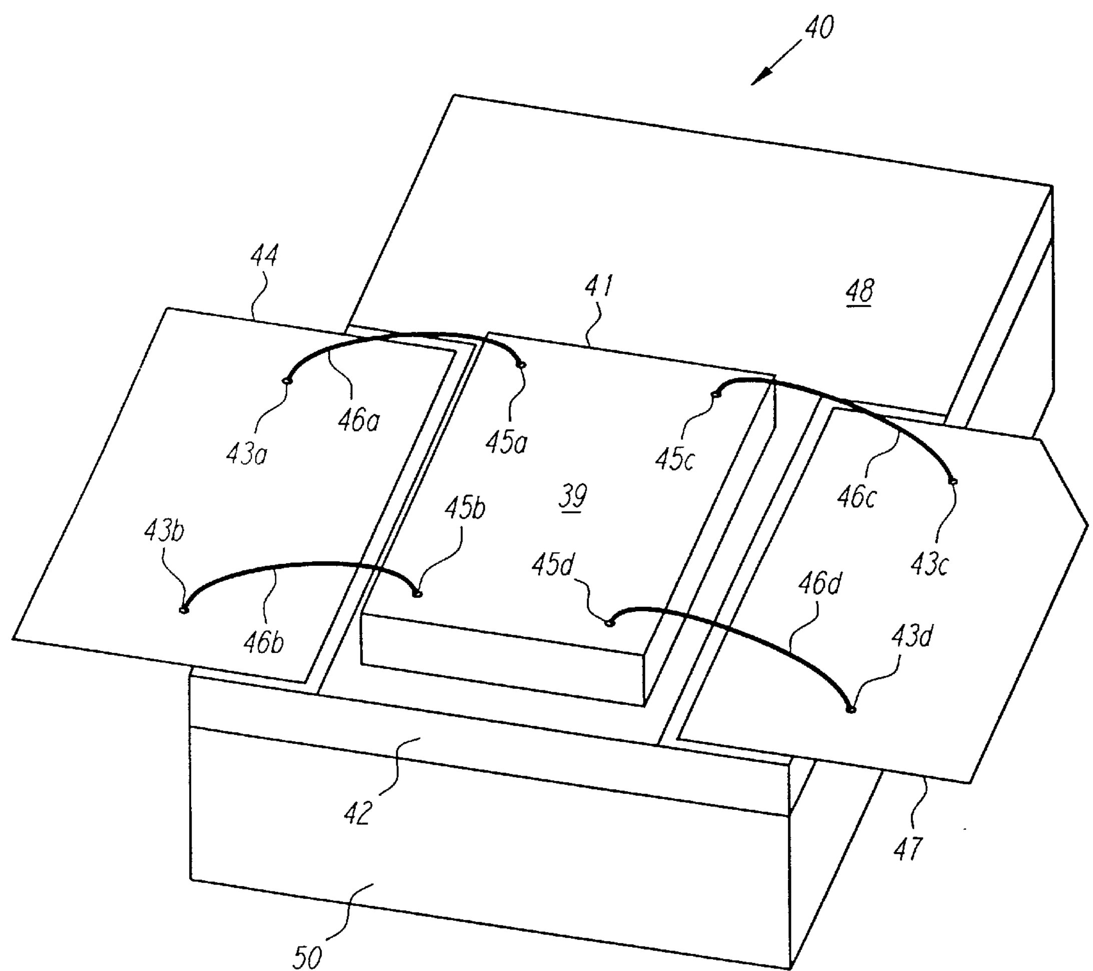
FIG. 4 is a perspective view of a second preferred embodiment of a power transistor package in accordance with the present invention.

Referring to FIG. 4, a second preferred power transistor package 40 includes a silicon die 41 attached to a rectangular shaped, ceramic substrate 42, which is suitably bonded to a mounting flange 50, using techniques known in the art. Again, the ceramic substrate 42 is preferably composed of an electrically isolating, but thermally conductive ceramic material, such as, e.g., alumina.

In a manner identical to the clamping members 26*a–d* of the package 20 depicted in FIG. 3, the silicon die 41 of package 40 is secured to a top surface 48 of the substrate 42 by a plurality of clamping members 46*a–d*, which stabilize and force a bottom surface (not shown in FIG. 4) of the silicon die 41 to make substantially uniform and constant contact with the top surface 48 of the substrate 42. In particular, respective first ends of first and second clamping members 46*a–b* are bonded (e.g., by using known ultrasonic wire bonding techniques) to corresponding anchor points 43*a–b* on an input lead frame 44, and respective first ends of third and fourth clamping members 46*c–d* are bonded to corresponding anchor points 43*c–d* on an output lead frame 47, respectively. Respective second ends of the clamping members 46*a–d* are bonded to corresponding anchor points 45*a–d* on a top surface 39 of the silicon die 41.

As will be apparent to those skilled in the art, clamping members 46*a–d* will have the same preferred characteristics as do members 26*a–d* of package 20 shown in FIG. 3—i.e., in terms of shape, material, conductivity, etc. As will also be apparent to those skilled in the art, an advantage of the present invention is that the substrate 42 can be made of a less expensive (and less toxic) material, since matching its thermal expansion coefficients with the die 41 is no longer a requirement (i.e., there is no eutectic bonding of the die 41 to the substrate 42).

Figure 5:
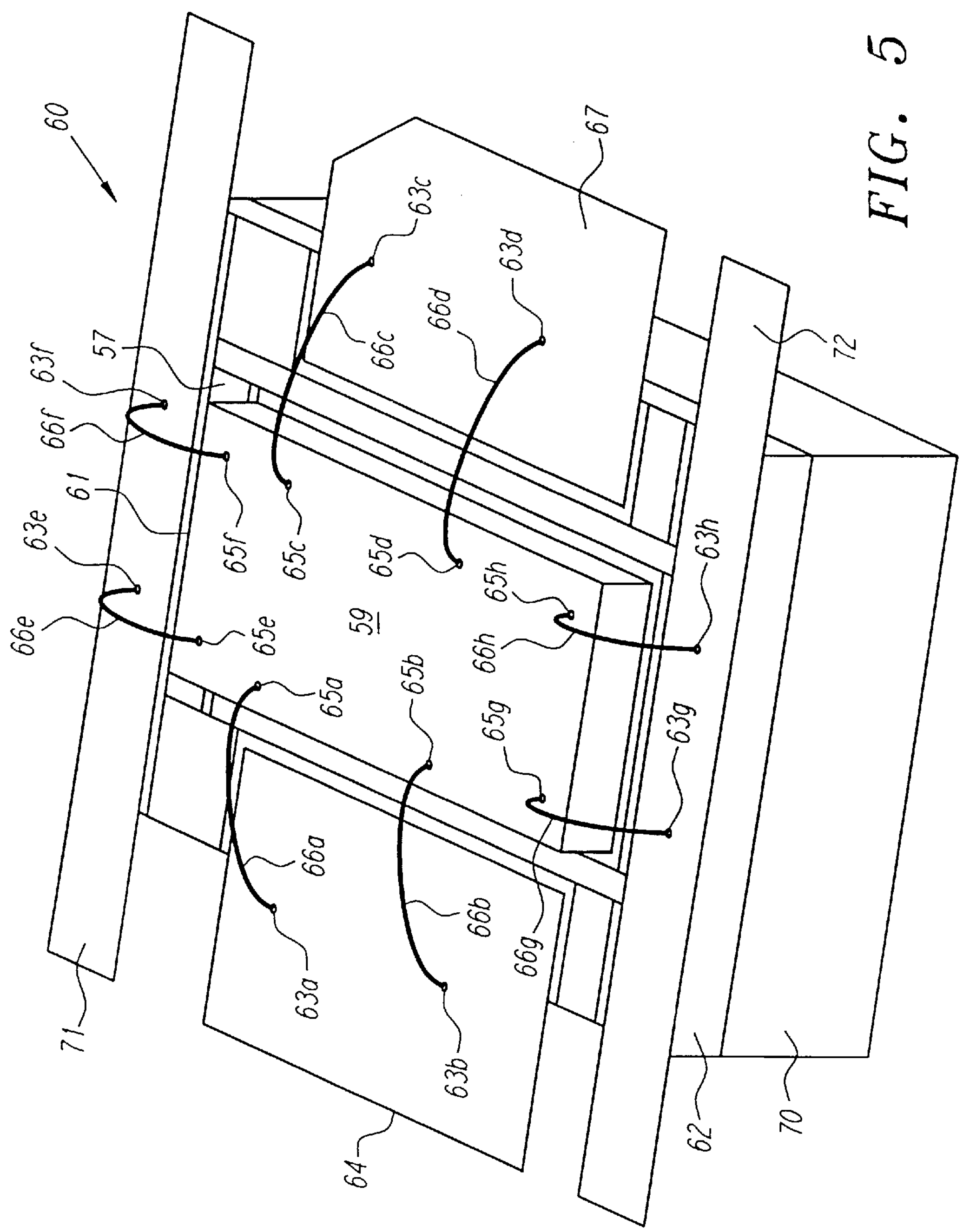
FIG. 5 is a perspective view of a third preferred embodiment of a power transistor package employing a direct contact die attach in accordance with the present invention.

Referring to FIG. 5, a third preferred power transistor package 60 includes a silicon die 61 attached to a rectangular shaped, ceramic substrate 62, which is suitably bonded to a mounting flange 70, using techniques known in the art. Again, the ceramic substrate 62 is preferably composed of an electrically isolating, but thermally conductive ceramic material, such as, e.g., alumina.

In a manner similar to the packages 20 and 40 respectively depicted in FIGS. 3 and 4, the silicon die 61 of package 60 is secured to a top surface 57 of the substrate 62 by a plurality of clamping members 66*a–h*, which stabilize and force a bottom surface (not shown in FIG. 5) of the silicon die 61 to make substantially uniform and constant contact with the top surface 57 of the ceramic substrate 62. In particular, respective first ends of first and second clamping members 66*a–b* are bonded (e.g., by using known ultrasonic wire bonding techniques) to corresponding anchor points 63*a–b* on an input lead frame 64, and respective first ends of third and fourth clamping members 66*c–d* are bonded to corresponding anchor points 63*c–d* on an output lead frame 67.

In addition, respective first ends of fifth and sixth clamping members 66*e–f* are bonded to corresponding anchor points 63*e–f* on a further (e.g., grounding output) lead frame 71, and respective first ends of seventh and eighth clamping members 66*g–h* are bonded to corresponding anchor points 63*g–h* on a still further output lead frame 72. Respective second ends of the eight clamping members 66*a–h* are bonded to corresponding anchor points 65*a–h* on a top surface 59 of the silicon die 61.

Again, the eight clamping members 66*a–h* have a selected length and arc are preferably made of a material (e.g., aluminum, or a gold or aluminum alloy), which is sufficiently resilient to stabilize and force the bottom surface of the semiconductor die 61 to make constant contact with the top surface 57 of substrate 62. As with the preferred embodiments of FIGS. 3 and 4, the length and arc of the clamping members 66*a–h* are preferably selected so that they apply an equal amount of pressure to corresponding anchor points 65*a–h* and, thus, the force exerted on the bottom surface of the semiconductor die 61 by the top surface 57 of the substrate 62 is evenly distributed. Also as in the afore-described preferred embodiments, clamping members 66*a–h* are preferably conductive and can conduct current from the respective anchor points 65*a–h* on the die 62 to the corresponding anchor points 63*a–h* on lead frames 64, 67, 71 and 72.

Thus, an improved method and apparatus for bonding semiconductor dice onto a transistor package has been disclosed. While preferred embodiments and applications of this invention have been shown and described, it would be apparent to those skilled in the art that many more modifications are possible without departing from the inventive concepts herein. The invention, therefore is not to be restricted except in the spirit of the appended claims.

What is claimed:

1. A transistor device, comprising:

a substrate having a top surface;

a semiconductor die having a bottom surface positioned on the top surface of the substrate, and a top surface;

a lead frame attached to the top surface of the substrate adjacent the semiconductor die; and a plurality of arcuate clamping members, each having a first end and a second end, wherein the first ends of the clamping members are bonded to the lead frame and the second ends of the clamping members are bonded to the top surface of the semiconductor die, the respective clamping members being sufficiently resilient to collectively apply a force against the top surface of the semiconductor die sufficient to substantially maintain contact between the bottom surface of the semiconductor die and the top surface of the substrate, the die and substrate not otherwise bonded to one another.

2. The transistor device of claim 1, further comprising a transistor cell formed on the top surface of the semiconductor die, at least one resilient clamping member being part of a circuit for conducting current between the transistor cell and the lead frame.

3. A transistor device, comprising:

a substrate having a top surface;

a semiconductor die having a bottom surface positioned on the top surface of the substrate, and a top surface;

first and second lead frames attached to the top surface of the substrate adjacent the semiconductor die; and first and second pluralities of arcuate clamping members, each clamping member having a first end and a second end, wherein the first ends of the first plurality of clamping members are bonded to the first lead frame, the second ends of the first plurality of clamping members are bonded to the top surface of the semiconductor die, the first ends of the second plurality of clamping members are bonded to the second lead frame, and the second ends of the second plurality of clamping members are bonded to the top surface of the semiconductor die, the respective clamping members being sufficiently resilient to collectively apply a force against the top surface of the semiconductor die sufficient to substantially maintain contact between the bottom surface of the semiconductor die and the top surface of the substrate, the die and substrate not otherwise bonded to one another.

4. The transistor device of claim 3, further comprising a transistor cell formed on the top surface of the semiconductor die, wherein at least one resilient clamping member of the first plurality of clamping members is part of a circuit for conducting current between the transistor cell and the first lead frame, and wherein at least one resilient clamping member of the second plurality of clamping members is part of a circuit for conducting current between the transistor cell and the second lead frame.

5. The transistor device of claim 4, wherein the first lead frame is an input current lead frame and the second lead frame is an output current lead frame.

6. A transistor package, comprising:

a mounting flange having a top surface;

a substrate having a bottom surface attached to the top surface of the mounting flange, and a top surface;

a semiconductor die having a bottom surface positioned on the top surface of the substrate, and a top surface;

first and second lead frames attached to the top surface of the substrate adjacent the semiconductor die; and first and second pluralities of arcuate clamping members, each clamping member having a first end and a second end, wherein the first ends of the first plurality of clamping members are bonded to the first lead frame, the second ends of the first plurality of clamping members are bonded to the top surface of the semiconductor die, the first ends of the second plurality of clamping members are bonded to the second lead frame, and the second ends of the second plurality of clamping members are bonded to the top surface of the semiconductor die, the respective clamping members being sufficiently resilient to collectively apply a force against the top surface of the semiconductor die sufficient to substantially maintain contact between the bottom surface of the semiconductor die and the top surface of the substrate, the die and substrate not otherwise bonded to one another.

* * * * *